(12) United States Patent
Aita et al.

(10) Patent No.: US 10,665,428 B2
(45) Date of Patent: May 26, 2020

(54) PLASMA PROCESSING APPARATUS

(71) Applicant: TOKYO ELECTRON LIMITED, Tokyo (JP)

(72) Inventors: Michitaka Aita, Yamanashi (JP); Naoki Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 480 days.

(21) Appl. No.: 15/421,630

(22) Filed: Feb. 1, 2017

(65) Prior Publication Data
US 2017/0229286 A1 Aug. 10, 2017

(30) Foreign Application Priority Data

Feb. 5, 2016 (JP) .................................. 2016-021181

(51) Int. Cl.
*H01J 37/32* (2006.01)

(52) U.S. Cl.
CPC .... *H01J 37/3222* (2013.01); *H01J 37/32229* (2013.01); *H01J 37/32238* (2013.01); *H01J 37/32715* (2013.01)

(58) Field of Classification Search
USPC ............ 156/345.41, 345.42, 345.51–345.55; 118/728–730, 723 MW, 723 ME, 118/723 MR; 361/234
See application file for complete search history.

(56) References Cited

U.S. PATENT DOCUMENTS

| | | | |
|---|---|---|---|
| 6,219,219 B1* | 4/2001 | Hausmann | H01L 21/6831 361/234 |
| 2006/0005930 A1* | 1/2006 | Ikeda | H01J 37/32431 156/345.51 |
| 2013/0001076 A1* | 1/2013 | Fujisato | C23C 14/358 204/298.08 |
| 2016/0111315 A1* | 4/2016 | Parkhe | H01L 21/67103 361/234 |

FOREIGN PATENT DOCUMENTS

| | | |
|---|---|---|
| JP | 07-127625 A | 5/1995 |
| JP | 63-107024 A | 5/1998 |
| JP | 2000-223475 A | 8/2000 |
| JP | 2015-109249 A | 6/2015 |

* cited by examiner

*Primary Examiner* — Rakesh K Dhingra
(74) *Attorney, Agent, or Firm* — Rothwell, Figg, Ernst & Manbeck, P.C.

(57) ABSTRACT

Disclosed is a plasma processing apparatus including: a processing container into which an electromagnetic wave for plasma excitation is supplied; a placing table provided inside the processing container and configured to place a workpiece thereon; a first coupling member inserted into each of a plurality of insertion portions formed in a part of a dielectric member that transmits the electromagnetic wave, among a plurality of members that constitute the placing table, and configured to couple the dielectric member and a member to be coupled; and a dielectric cap fitted to each of the plurality of insertion portions so as to cover the first coupling member and having a dielectric constant substantially equal to the dielectric constant of the dielectric member.

5 Claims, 8 Drawing Sheets

PLASMA PROCESSING APPARATUS

CROSS-REFERENCE TO RELATED APPLICATIONS

This application is based on and claims priority from Japanese Patent Application No. 2016-021181 filed on Feb. 5, 2016 with the Japan Patent Office, the disclosure of which is incorporated herein in its entirety by reference.

TECHNICAL FIELD

Various aspects and exemplary embodiments of the present disclosure relate to a plasma processing apparatus.

BACKGROUND

In a conventional plasma processing apparatus, plasma is generated by exciting a processing gas supplied into a processing container with electromagnetic waves such as, for example, microwaves. In the plasma processing apparatus, a workpiece, which is a plasma processing target, is placed on a placing table provided inside the processing container. See, for example, Japanese Patent Laid-Open Publication No. 2015-109249.

SUMMARY

In an aspect of the present disclosure, a plasma processing apparatus includes: a processing container into which an electromagnetic wave for plasma excitation is supplied; a placing table provided inside the processing container and configured to place a workpiece thereon; a first coupling member inserted into each of a plurality of insertion portions formed in a part of a dielectric member that transmits the electromagnetic wave, among a plurality of members that constitute the placing table, and configured to couple the dielectric member and a member to be coupled; and a dielectric cap fitted to each of the plurality of insertion portions so as to cover the first coupling member and having a dielectric constant substantially equal to the dielectric constant of the dielectric member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
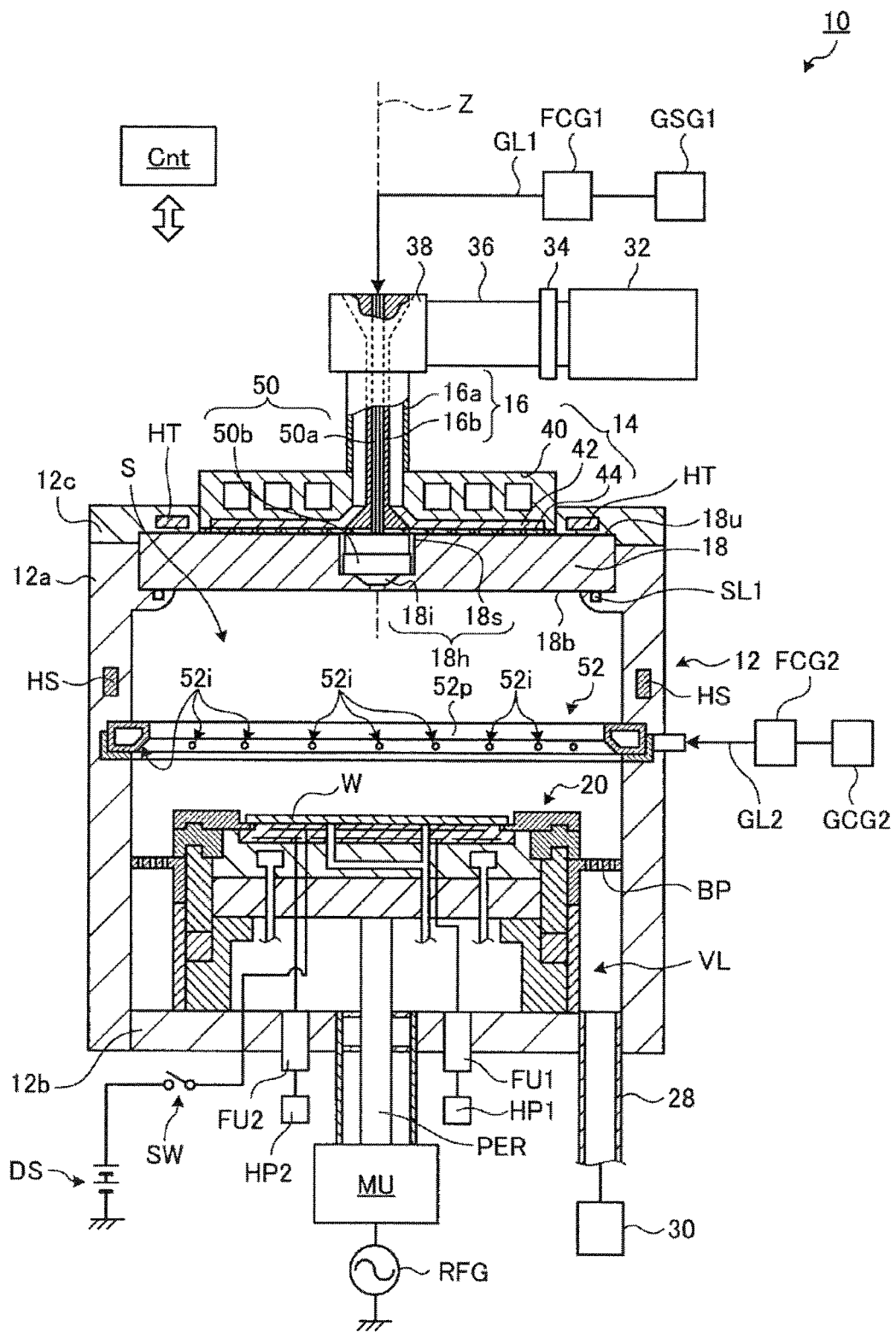
FIG. 1 is a schematic view illustrating a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Among a plurality of members constituting a placing table, a specific member may be coupled to another member by a screw member in some cases. For example, a dielectric support member, which supports an electrode member of the placing table, and a bottom portion of a processing container are coupled by a screw member. In this case, the screw member is inserted into an insertion portion formed in a part of the support member. Then, in order to protect the exposed portion of the screw member, a cap formed of a heat-resistant resin is fitted to the insertion portion of the support member so as to cover the screw member. The insertion portion is, for example, a spot facing portion or a cutout portion.

However, in a structure using a cap formed of a heat-resistant resin, the dielectric constant of the cap formed of a heat-resistant resin and the dielectric constant of the dielectric support member are different, so that electromagnetic waves are reflected on the interface between the support member and the cap. The electromagnetic waves reflected on the interface between the support member and the cap increase the number of modes of a standing wave in the vicinity of the placing table. Due to the standing wave, the uniformity of the electric field intensity in the vicinity of the placing table is impaired.

In an aspect of the present disclosure, a plasma processing apparatus includes: a processing container into which an electromagnetic wave for plasma excitation is supplied; a placing table provided inside the processing container and configured to place a workpiece thereon; a first coupling member inserted into each of a plurality of insertion portions formed in a part of a dielectric member that transmits the electromagnetic wave, among a plurality of members that constitute the placing table, and configured to couple the dielectric member and a member to be coupled; and a dielectric cap fitted to each of the plurality of insertion portions so as to cover the first coupling member and having a dielectric constant substantially equal to the dielectric constant of the dielectric member.

In the above-described plasma processing apparatus, the placing table includes a first electrode member, and a support member that is provided in a bottom portion of the processing container and supports the first electrode member, as the plurality of members, the dielectric member is the support member, the first coupling member couples the support member and the bottom portion of the processing container, and the dielectric cap is fitted to each of the plurality of insertion portions of the support member so as to cover the first coupling member.

The above-described plasma processing apparatus further includes a second coupling member inserted into each of a plurality of insertion portions formed in a part of a conductor member that reflects the electromagnetic wave, among the plurality of members that constitute the placing table, and configured to couple the conductor member and a member to be coupled; and a conductor cap fitted to each of the plurality of insertion portions of the conductor member so as to cover the second coupling member.

In the above-described plasma processing apparatus, the placing table includes a first electrode member, and a second electrode member that is provided on the first electrode member, as the plurality of members, the conductor member is the second electrode member, the second coupling member couples the second electrode member and the first electrode member, and the conductor cap is fitted to each of the plurality of insertion portions of the second electrode member so as to cover the second coupling member.

In another aspect of the present disclosure, a plasma processing apparatus includes: a processing container into which an electromagnetic wave for plasma excitation is supplied; a placing table provided inside the processing container and configured to place a workpiece thereon; a coupling member inserted into each of a plurality of insertion portions formed in a part of a conductor member that reflects the electromagnetic wave, among a plurality of members that constitute the placing table, and configured to couple the conductor member and a member to be coupled; and a conductor cap fitted to each of the plurality of insertion portions of the conductor member so as to cover the coupling member.

According to an aspect of the plasma processing apparatus of the present disclosure, the uniformity of the electric field intensity in the vicinity of the placing table may be improved.

Hereinafter, exemplary embodiments of the plasma processing apparatus disclosed herein will be described in detail with reference to drawings. Meanwhile, in the respective drawings, the same or corresponding parts will be denoted by the same symbols.

FIG. 1 is a schematic view illustrating a plasma processing apparatus according to an exemplary embodiment. FIG. 1 schematically illustrates a vertical-section of the plasma processing apparatus. The plasma processing apparatus 10 illustrated in FIG. 1 generates plasma by exciting a processing gas using a microwave and processes a workpiece (hereinafter, referred to as a "wafer") W with the plasma.

The plasma processing apparatus 10 includes a processing container 12. The processing container 12 defines a processing space S therein. In the plasma processing apparatus 10, the wafer W is accommodated in the processing space S, and a plasma processing is performed on the wafer W. In an exemplary embodiment, the processing container 12 includes a sidewall 12a, a bottom 12b, and a ceiling 12c. The sidewall 12a has a substantially cylindrical shape that extends in a direction where an axis Z extends (hereinafter, referred to as an "axis Z direction"). The bottom 12b is provided at a lower end side of the sidewall 12a. The upper end portion of the sidewall 12a is opened. The upper end opening of the sidewall 12a is closed by a dielectric window 18. The dielectric window 18 is interposed between the upper end portion of the sidewall 12a and the ceiling 12c. A sealing member SL1 may be interposed between the dielectric window 18 and the upper end portion of the sidewall 12a. The sealing member SL1 is, for example, an O-ring, and contributes to sealing of the processing container 12.

The plasma processing apparatus 10 further includes a placing table 20. The placing table 20 is provided below the dielectric window 18 in the processing container 12. The wafer W is placed on the placing table 20. Details of the placing table 20 and its surrounding components will be described later.

As illustrated in FIG. 1, the plasma processing apparatus 10 may further includes a heater HT and a heater HS. The heater HT is provided in the ceiling 12c, and extends annularly to surround an antenna 14. Further, the heater HS is provided inside the sidewall 12a, and extends annularly.

Further, in an exemplary embodiment, the plasma processing apparatus 10 may further include an antenna 14, a coaxial waveguide 16, a dielectric window 18, a microwave generator 32, a tuner 34, a waveguide 36, and a mode converter 38 in order to introduce microwaves into the processing container 12. The microwave generator 32 generates microwaves in a GHz band, for example, microwaves having a frequency of 2.45 GHz. The microwave generator 32 is connected to the upper portion of the coaxial waveguide 16 via the tuner 34, the waveguide 36, and the mode converter 38. The coaxial waveguide 16 extends along the axis Z.

The coaxial waveguide 16 includes an outer conductor 16a and an inner conductor 16b. The outer conductor 16a has a substantially cylindrical shape that extends in the axis Z direction. The central axis of the outer conductor 16a substantially coincides with the axis Z. The lower end of the outer conductor 16a is electrically connected to the upper portion of the cooling jacket 40 having a conductive surface. The inner conductor 16b is provided coaxially with the outer conductor 16a inside the outer conductor 16a. In an exemplary embodiment, the inner conductor 16b has a substantially cylindrical shape that extends in the axis Z direction. The lower end of the inner conductor 16b is connected to a slot plate 44 of the antenna 14.

In an exemplary embodiment, the antenna 14 is a radial line slot antenna. The antenna 14 is disposed in the opening formed in the ceiling 12c, and provided on the upper surface of the dielectric window 18. The antenna 14 includes a dielectric plate 42 and a slot plate 44. The dielectric plate 42 shortens the wavelength of the microwaves, and has a substantially disc shape. The dielectric plate 42 is made of, for example, quartz or alumina. The dielectric plate 42 is interposed between the slot plate 44 and the lower surface of the cooling jacket 40. Therefore, the antenna 14 includes the dielectric plate 42, the slot plate 44, and the lower surface of the cooling jacket 40.

Figure 2:
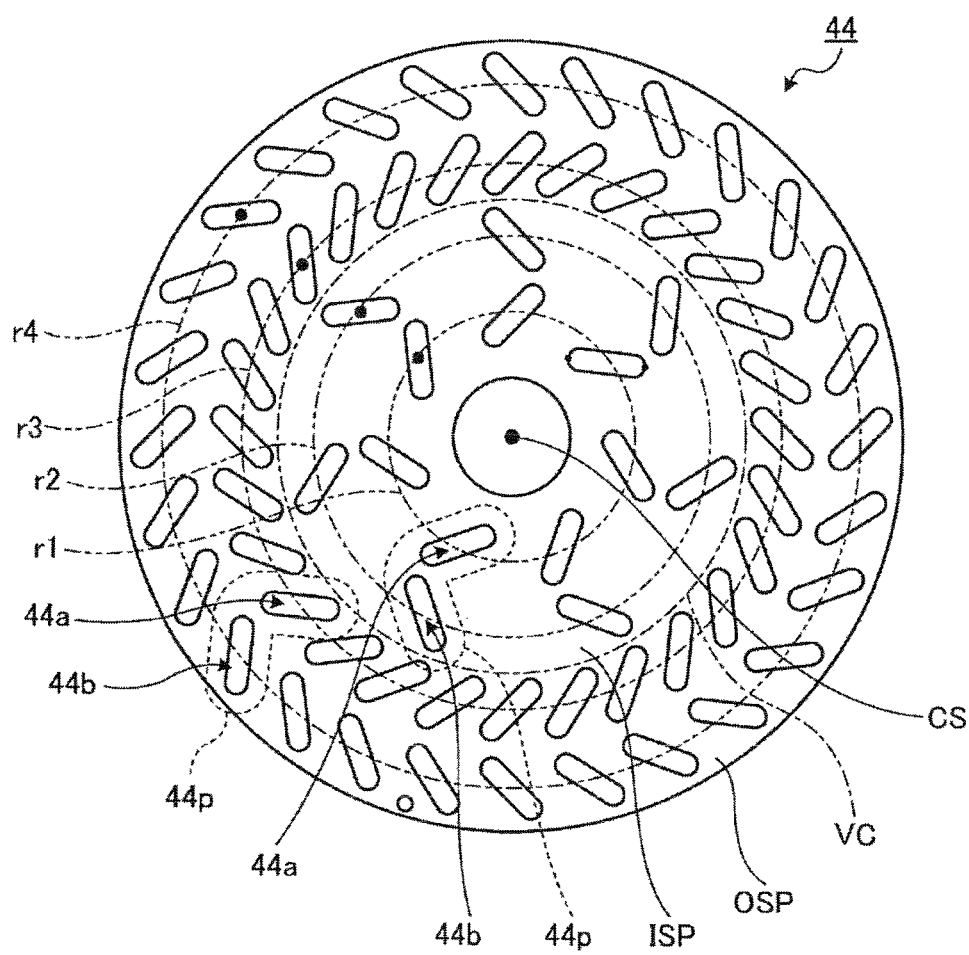
FIG. 2 is a plan view illustrating an exemplary slot plate.

FIG. 2 is a plan view illustrating an exemplary slot plate. The slot plate 44 is in a thin plate form, and has a disc shape. Both sides of the slot plate 44 in the plate thickness direction are flat. A center CS of the circular slot plate 44 is positioned on the axis Z. A plurality of slot pairs 44p are provided in the slot plate 44. Each of the plurality of slot pairs 44p includes two slot holes 44a, 44b penetrating the slot plate 44 in the plate thickness direction. The planar shape of each of the slot holes 44a, 44b is an elongated hole shape. In each slot pair 44p, a direction where the major axis of the slot hole 44a extends and a direction where the major axis of the slot hole 44b extends intersect with each other or are orthogonal to each other.

In the example illustrated in FIG. 2, the plurality of slot pairs 44p are roughly divided into an inner slot pair group ISP provided inside a virtual circle VC around the axis Z and an outer slot pair group OSP provided outside the virtual circle VC. The inner slot pair group ISP includes a plurality of slot pairs 44p. In the example illustrated in FIG. 2, the inner slot pair group ISP includes seven (7) slot pairs 44p. The plurality of slot pairs 44p of the inner slot pair group ISP are arranged at equal intervals in the circumferential direction with respect to the center CS. The plurality of slot holes 44a included in the inner slot pair group ISP are arranged at equal intervals such that the center of gravity of each slot hole 44a is positioned on a circle having a radius r1 from the center CS of the slot plate 44. Further, the plurality of slot holes 44b included in the inner slot pair group ISP are arranged at equal intervals such that the center of gravity of each slot hole 44b is positioned on a circle having a radius r2 from the center CS of the slot plate 44. Here, the radius r2 is larger than the radius r1.

The outer slot pair group OSP includes a plurality of slot pairs 44p. In the example illustrated in FIG. 2, the outer slot pair group OSP includes twenty eight (28) slot pairs 44p. The plurality of slot pairs 44p of the outer slot pair group OSP are arranged at equal intervals in the circumferential direction with respect to the center CS. The plurality of slot holes 44a included in the outer slot pair group OSP are arranged at equal intervals such that the center of gravity of each slot hole 44a is positioned on a circle having a radius r3 from the center CS of the slot plate 44. Further, the plurality of slot holes 44b included in the outer slot pair group OSP are arranged at equal intervals such that the center of gravity of each slot hole 44b is positioned on a circle having a radius r4 from the center CS of the slot plate 44. Here, the radius r3 is larger than the radius r2, and the radius r4 is larger than the radius r3.

Further, each slot hole 44a of the inner slot pair group ISP and the outer slot pair group OSP is formed such that its long axis has the same angle with respect to a line segment connecting the center CS and its center of gravity. Further, each slot hole 44b of the inner slot pair group ISP and the outer slot pair group OSP is formed such that its long axis has the same angle with respect to a line segment connecting the center CS and its center of gravity.

The descriptions will refer back to FIG. 1. The dielectric window 18 has a substantially disc shape, and is made of a dielectric such as, for example, quartz or alumina. The slot plate 44 is provided on an upper surface 18u of the dielectric window 18.

A through-hole 18h is formed in the center of the dielectric window 18. The upper portion of the through-hole 18h is a space 18s in which an injector 50b of a central introduction unit 50 (to be described) is accommodated, and the lower portion is a central introduction port 18i of the central introduction unit 50 (to be described). The central axis of the dielectric window 18 substantially coincides with the axis Z. A surface opposite to the upper surface 18u of the dielectric window, that is, a lower surface 18b abuts onto the processing space S, and is a surface at a side where plasma is generated.

The microwaves generated by the microwave generator 32 is propagated to the dielectric window 42 via the coaxial waveguide 16, and is supplied from the slot holes 44a and 44b of the slot plate 44 to the inside of the processing container 12 (i.e., processing space S) via the dielectric window 18.

Further, the plasma processing apparatus 10 includes a central introduction unit 50 and a peripheral introduction unit 52. The central introduction unit 50 includes a conduit 50a, an injector 50b, and a central introduction port 18i. The conduit 50a is passed through the inner hole of the inner conductor 16b of the coaxial waveguide 16. In addition, the end portion of the conduit 50a extends to the inside of the space 18s of the dielectric window 18, which is defined along the axis Z. The injector 50b is accommodated in the space 18s and below the end portion of the conduit 50a. The injector 50b includes a plurality of through-holes extending in the axis Z direction. Further, the central introduction port 18i is defined in the dielectric window 18. The central introduction port 18i is continuous below the space 18s and extends along the axis Z. The central introduction unit 50 having such a configuration supplies a gas to the injector 50b via the conduit 50a and injects the gas from the injector 50b via the central introduction port 18i. In this manner, the central introduction part 50 injects the gas directly below the dielectric window 18 along the axis Z. That is, the central introduction unit 50 introduces the gas into the plasma generation region where the electron temperature is high.

The peripheral introduction unit 52 includes a plurality of peripheral introduction ports 52i. The plurality of peripheral introduction ports 52i supply the gas mainly to the edge region of the wafer W. The plurality of peripheral introduction ports 52i are opened toward the edge region of the wafer W. The plurality of peripheral introduction ports 52i are arranged below the central introduction port 18i and above the placing table 20 along the circumferential direction. That is, the plurality of peripheral introduction ports 52i are arranged annularly around the axis Z in a region (plasma diffusion region) where the electron temperature is lower than the region directly below the dielectric window 18. The peripheral introduction unit 52 supplies the gas from the region where the electron temperature is low, toward the wafer W. Therefore, the dissociation degree of the gas introduced from the peripheral introduction unit 52 into the processing space S is suppressed to be lower than the dissociation degree of the gas supplied from the central introduction unit 50 to the processing space S.

The central introduction unit 50 is connected with a first gas source group GSG1 via a first flow rate control unit group FCG1. Further, the peripheral introduction unit 52 is connected with a second gas source group GSG2 via a second flow rate control unit group FCG2. The first gas source group GSG1 includes a plurality of first gas sources, and the first flow rate control unit group FCG1 includes a plurality of first flow rate control units. The plurality of first gas sources are connected to a common gas line GL1 via the plurality of first flow rate control units, respectively. The common gas line GL1 is connected to the central introduction unit 50. Further, each of the plurality of first flow rate control units includes, for example, two (2) valves and a flow rate controller provided between the two (2) valves. The flow rate controller is, for example, a mass flow controller.

The second gas source group GSG2 includes a plurality of second gas sources, and the second flow rate control unit group FCG2 includes a plurality of second flow rate control units. The plurality of second gas sources are connected to a common gas line GL2 via the plurality of second flow rate control units, respectively. The common gas line GL2 is connected to the peripheral introduction unit 52. Further, each of the plurality of second flow rate control units includes, for example, two (2) valves and a flow rate controller provided between the two (2) valves. The flow rate controller is, for example, a mass flow controller.

As described above, in the plasma processing apparatus 10, the plurality of first gas sources and the plurality of first flow rate control units are provided exclusively for the central introduction unit 50, and the plurality of second gas sources and the plurality of second flow rate control units, which are independent from the plurality of first gas sources and the plurality of first flow rate control units, are provided exclusively for the peripheral introduction unit 52. Therefore, the types of one or more gases included in the processing gas introduced into the processing space S from the central introduction unit 50, and the flow rates of the one or more gases included in the processing gas introduced into the processing space S from the central introduction unit 50 may be controlled independently. Further, the types of one or more gases included in the processing gas introduced into the processing space S from the peripheral introduction unit 52, and the flow rates of the one or more gases included in the processing gas introduced into the processing space S from the peripheral introduction unit 52 may be controlled independently.

In an exemplary embodiment, the plasma processing apparatus 10 may further include a controller Cnt, as illustrated in FIG. 1. The controller Cnt may be a control device such as a programmable computer device. The controller Cnt may control respective parts of the plasma processing apparatus 10 according to a program based on a recipe. For example, the controller Cnt may transmit a control signal to each flow rate control unit of the first flow rate control unit group FCG1 to control the types of gases introduced from the central introduction unit 50 and the flow rates of the gases. In addition, the controller Cnt may transmit a control signal to each flow rate control unit of the second flow rate control unit group FCG2 to control the types of gases introduced from the peripheral introduction unit 52 and the flow rates of the gases. Further, the controller Cnt may supply a control signal to the microwave generator 32, a high frequency power supply RFG, and an exhaust device 30 to control the power of microwaves, the power and ON/OFF of a high frequency bias, and a pressure in the processing container 12.

In an exemplary embodiment, the peripheral introduction unit 52 further includes an annular pipe 52p. The pipe 52p includes a plurality of peripheral introduction ports 52i formed therein. The annular pipe 52p may be made of, for example, quartz. As illustrated in FIG. 1, in an exemplary embodiment, the annular pipe 52p is provided along the inner wall surface of the sidewall 12a. In other words, the annular pipe 52p is not arranged on the path connecting the lower surface of the dielectric window 18 and the wafer W. Therefore, the annular pipe 52p does not inhibit the diffusion of the plasma. Further, since the annular pipe 52p is provided along the inner wall surface of the sidewall 12a, consumption of the annular pipe 52p by the plasma is suppressed, and the frequency of replacement of the annular pipe 52p may be reduced. Furthermore, since the annular pipe 52p is provided along the sidewall 12a of which the temperature is controllable by the heater, it is possible to improve the temperature stability of the gas introduced into the processing space S from the peripheral introduction part 52.

In addition, in an exemplary embodiment, the plurality of peripheral introduction ports 52i are opened toward the edge region of the wafer W. That is, the plurality of peripheral introduction ports 52i are inclined with respect to a plane orthogonal to the axis Z so as to inject the gas toward the edge region of the wafer W. Therefore, since the peripheral introduction ports 52i are opened so as to be inclined toward the edge region of the wafer W, the active species of the gas ejected from the peripheral introduction ports 52i proceed directly to the edge region of the wafer W. Thus, the active species of the gas may be supplied to the edge of the wafer W without being deactivated. As a result, it is possible to reduce a deviation in processing speed of each region in the radial direction of the wafer W.

Figure 3:
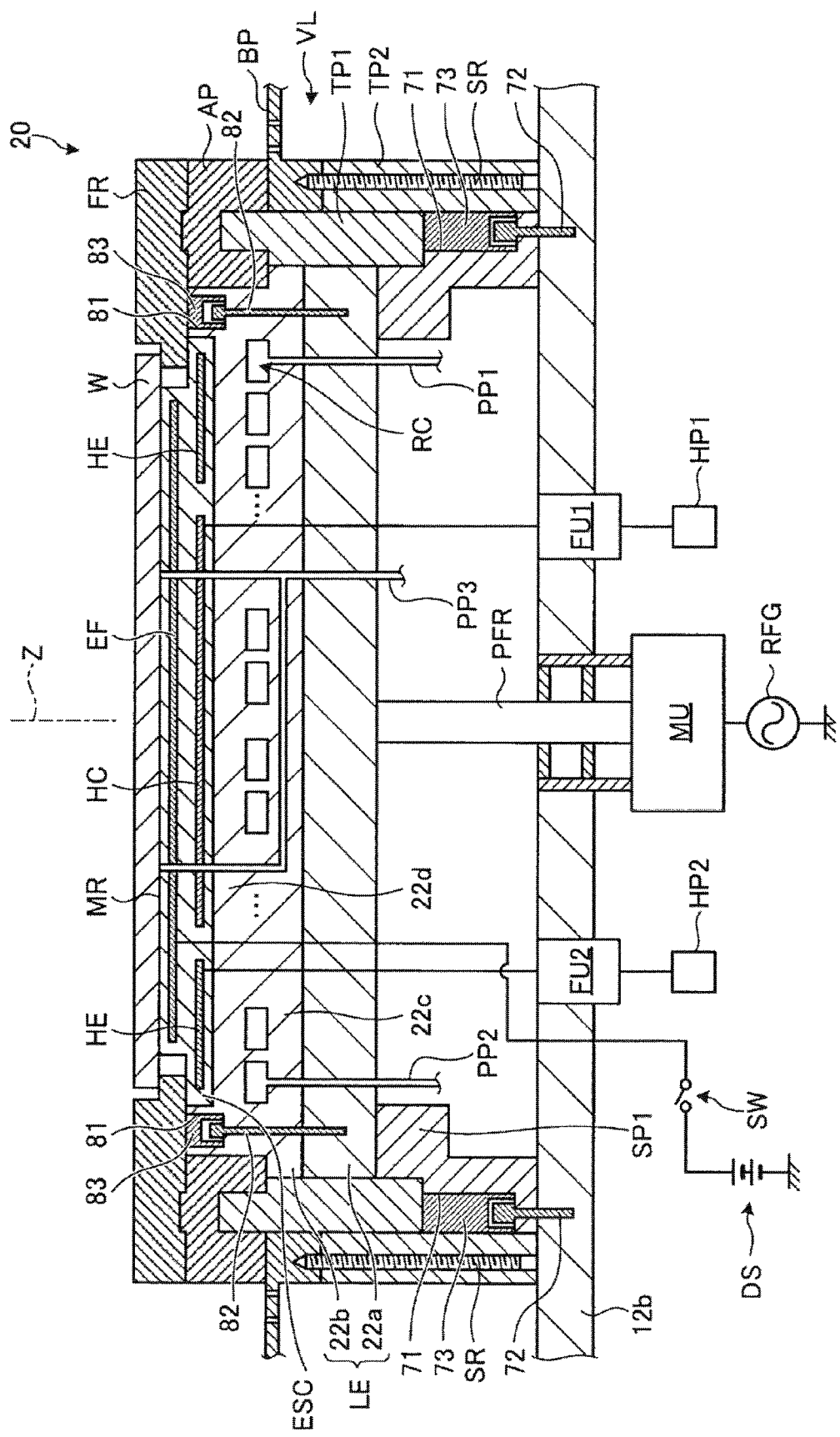
FIG. 3 is a view illustrating a configuration of the placing table illustrated in FIG. 1 and the periphery of the placing table in an enlarged scale.

Next, the configuration of the placing table 20 and the periphery of the placing table 20 will be described in detail with reference to FIG. 3. FIG. 3 is a view illustrating a configuration of the placing table illustrated in FIG. 1 and the periphery of the placing table in an enlarged scale. The placing table 20 includes a support member SP1, a lower electrode LE, a focus ring FR, and an electrostatic chuck ESC. The lower electrode LE includes a first electrode member 22a and a second electrode member 22b.

Figure 4:
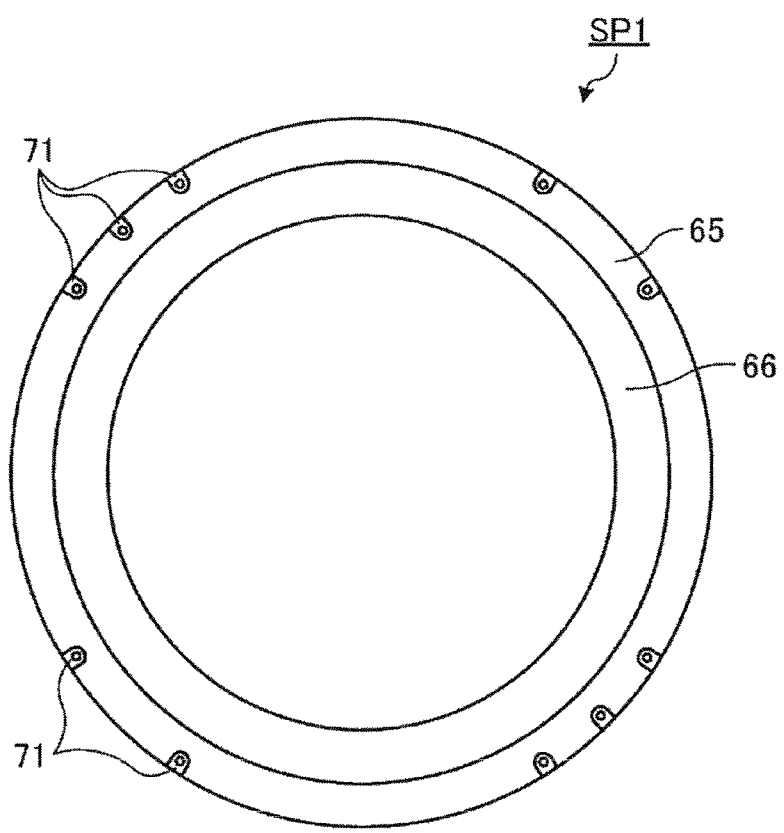
FIG. 4 is a plan view of a support member according to an exemplary embodiment when viewed from a processing space side.

The support member SP1 is provided on the bottom 12b of the processing container 12, and supports the first electrode member 22a of the lower electrode LE. The support member SP1 transmits the microwaves which are supplied from the dielectric window 18 to the inside of the processing container 12 (i.e., the processing space S) and propagated from the focus ring FR side to the support member SP1. FIG. 4 is a plan view of a support member according to an exemplary embodiment when viewed from a processing space side. The support member SP1 is made of a dielectric (e.g., quartz), and is formed in a substantially cylindrical shape as illustrated in FIG. 4. The support member SP1 is an example of the dielectric member. The support member SP1 includes a base 65 that abuts onto the bottom 12b of the processing container 12, and a main body 66 that is continuous with the base 65 and supports the first electrode member 22a of the lower electrode LE. The base 65 of the support member SP1 is formed with a plurality of insertion portions 71. Each insertion portion 71 is, for example, a spot facing portion or a cutout portion. In an exemplary embodiment, the plurality of the insertion portions 71 are arranged at arbitrary intervals along the circumferential direction of the support member SP1. In other words, the plurality of insertion portions 71 are arranged so as not to be rotationally symmetrical when viewed from the direction along the central axis of the support member SP1.

FIG. 3 is referred to again. A screw member 72 is inserted into each of the plurality of insertion portions 71 of the support member SP1. The screw member 72 is made of a conductor (e.g., metal), and couples the support member SP1 and the bottom 12b of the processing container 12 which is a member to be coupled (hereinafter, referred to as a "coupling target member"). The screw member 72 is an example of the first coupling member.

Each of the plurality of insertion portions 71 of the support member SP1 is closed by a cap 73. The cap 73 is fitted to the insertion portion 71 of the support member SP1 to cover the screw member 72. The cap 73 is made of a dielectric, and has a dielectric constant substantially equal to the dielectric constant of the support member SP1. In an exemplary embodiment, the cap 73 is made of the same dielectric as the dielectric constituting the support member SP1, and has a dielectric constant equal to the dielectric constant of the support member SP1. In the case where the dielectric constant of the cap 73 and the dielectric constant of the support member SP1 are substantially the same, the microwaves are suppressed from being reflected on the interface between the support member SP1 and the cap 73 even when the microwaves transmitted through the support member SP1 reach the interface between the support member SP1 and the cap 73. This suppresses an occurrence of standing waves in the vicinity of the placing table 20 due to the reflection of the microwaves.

The first electrode member 22a is a substantially disc-shaped member. Further, the first electrode member 22a is formed of a conductive member (conductor), for example, aluminum. The central axis of the first electrode member 22a substantially coincides with the axis Z. The first electrode member 22a is supported by the support member SP1.

The second electrode member 22b is provided on the first electrode member 22a. The second electrode member 22b is a substantially disc-shaped member. Further, the second electrode member 22b is formed of a conductive member (conductor), for example, aluminum. The second electrode member 22b is conducted with the first electrode member 22a. Further, the central axis of the second electrode member 22b substantially coincides with the axis Z. In an exemplary embodiment, the second electrode member 22b includes a large-diameter portion 22c and a small-diameter portion 22d. The large-diameter 22c is continuous with the small-diameter portion 22d at the lower side of the small-diameter portion 22d. Further, the diameter of the large-diameter portion 22c is larger than that of the small-diameter portion 22d, and is substantially equal to the diameter of the first electrode member 22a. The second electrode member 22b reflects the microwaves which are supplied from the dielectric window 18 to the inside of the processing container 12 (i.e., the processing space S) and propagated from the focus ring FR side to the second electrode member 22b. The small-diameter portion 22d of the second electrode member 22b is formed with a plurality of insertion portions 81. Each insertion portion 81 is, for example, a spot facing portion or a cutout portion. In an exemplary embodiment, the plurality of the insertion portions 81 are arranged at arbitrary intervals along the circumferential direction of the second electrode member 22b. In other words, the plurality of insertion portions 81 are arranged so as not to be rotationally symmetrical when viewed from the direction along the central axis of the second electrode member 22b.

A screw member 82 is inserted into each of the plurality of insertion portions 81 of the second electrode member 22b. The screw member 82 is made of a conductor (e.g., metal), and couples the second electrode member 22b and the first electrode member 22a which is a coupling target member. The screw member 82 is an example of the second coupling member.

Each of the plurality of insertion portions 81 of the second electrode member 22b is closed by a cap 83. The cap 83 is fitted to each of the plurality of insertion portions 81 of the second electrode member 22b to cover the screw member 82. The cap 83 is made of a conductor. In an exemplary embodiment, the cap 83 is made of the same conductor as the conductor constituting the second electrode member 22b. When the conductor cap 83 is fitted to each of the plurality of insertion portions 81 of the second electrode member 22b, the microwaves directed to the screw member 82 are blocked by the cap 83. Thus, it is possible to avoid a situation where the microwaves are reflected by the screw member 82 in an unintended direction. This suppresses an occurrence of standing waves in the vicinity of the placing table 20 due to the reflection of the microwaves.

The first electrode member 22a is electrically connected with a high frequency power supply RFG via a power feeding rod PFR and a matching unit MU. The high frequency power supply RFG outputs a high frequency bias power of a constant frequency suitable for controlling the energy of the ions drawn into the wafer W (e.g., 13.56 MHz). The matching unit MU accommodates a matcher for matching between the impedance of the high frequency power supply RFG side and the impedance of the load side such as, mainly, the electrode, the plasma, and the processing container 12. A blocking capacitor for self-bias generation is included in the matcher.

A coolant chamber RC is provided within the second electrode member 22b. The coolant chamber RC extends helically around the axis Z. In the coolant chamber RC, a coolant of a predetermined temperature, for example, cooling water is circularly supplied from a chiller unit through pipes PP1, PP2. The temperature of the wafer W on the electrostatic chuck ESC may be controlled by the coolant circulated as described above. Further, a heat transfer gas (e.g., He gas) from a heat transfer gas supply unit is supplied between the upper surface of the electrostatic chuck 20b and the rear surface of the wafer W through a supply pipe PP3.

The electrostatic chuck ESC is provided on the upper surface of the second electrode member 22b. The electrostatic chuck ESC has a substantially disc shape, and the central axis thereof substantially coincides with the central axis Z. The upper surface of the electrostatic chuck ESC provides a placement region MR for placing the wafer W thereon. The placement region MR is substantially circular, and the central axis thereof is positioned substantially on the axis Z. The electrostatic chuck ESC holds the wafer W by an electrostatic attraction force. Therefore, the electrostatic chuck ESC includes an electrode film EF sandwiched between dielectric films. The electrode film EF is electrically connected with a DC power supply DS via a switch SW. The electrostatic chuck ESC may attract the wafer W to the upper surface by a Coulomb force generated by the DC voltage applied from the DC power supply DS, and hold the wafer W thereon.

Further, a heater HC and a heater HE are provided in the dielectric film of the electrostatic chuck ESC. The heater HC and the heater HE are constituted with, for example, heating wires. The heater HC is provided below the electrode film EF and below the central portion of the placement region MR described above, that is, in a region intersecting with the axis Z. In addition, the heater HE is provided below the electrode film EF, and extends to surround the heater HC.

The heater HC is connected with a heater power supply HP1 via a filter unit FU1. The heater power supply HP1 supplies an AC power to the heater HC. The filter unit FU1 suppresses the high frequency power from the high frequency power supply RFG from flowing into the heater power supply HP1. The filter unit FU1 is constituted with, for example, an LC filter. In addition, the heater HE is connected with a heater power supplies HP2 via a filter unit FU2. The heater power supply HP2 supplies an AC power to the heater HE. The filter unit FU2 suppresses the high frequency power from the high frequency power supply RFG from flowing into the heater power supply HP2. The filter unit FU2 is constituted with, for example, an LC filter. The filter units FU1 and FU2 suppress the high frequency power from the high frequency power supply RFG from flowing into the heater power supplies and being consumed.

Further, a focus ring FR is provided radially outside the electrostatic chuck ESC. The focus ring FR extends annularly along the edge of the electrostatic chuck ESC and the edge of the wafer W to surround the electrostatic chuck ESC. The focus ring FR is made of a dielectric such as quartz. The focus ring FR is provided to adjust the sheath potential outside the edge of the wafer W, and contributes to the in-plane uniformity of the plasma processing of the wafer W.

A tubular portion TP1 is provided below the focus ring FR. The tubular portion TP1 is made of a dielectric such as alumina. The tubular portion TP1 extends along the outer peripheral surface of the lower electrode LE. In an exemplary embodiment, the tubular portion TP1 extends along the outer peripheral surface of the upper portion of the support member SP1, the outer peripheral surface of the first electrode member 22a, and the outer peripheral surface of the large-diameter portion 22c of the second electrode member 22b.

An annular portion AP is provided between the tubular portion TP1 and the focus ring FR. The annular portion AP is made of a dielectric such as alumina. The annular portion AP extends annularly along the outer peripheral surface of the small-diameter portion 22d of the second electrode member 22b. The upper surface of the annular portion AP abuts onto the lower surface of the focus ring FR. In an exemplary embodiment, the upper surface of the annular portion AP includes a convex portion that protrudes upward. The convex portion of the annular portion AP extends annularly in the middle between the inner edge and the outer edge of the upper surface of the annular portion AP. Meanwhile, the lower surface of the focus ring FR defines a concave portion into which the convex portion of the annular portion AP is fitted. Therefore, the position of the focus ring FR is determined by mounting the focus ring FR on the annular portion AP.

Further, a concave portion is formed on the lower surface of the annular portion AP. The concave portion extends annularly in the middle between the inner edge and the outer edge of the lower surface of the annular portion AP.

In addition, a tubular portion TP2 is provided below the annular portion AP. The tubular portion TP2 has a substantially cylindrical shape. The tubular portion TP2 extends along the outer peripheral surface of the tubular portion TP1. In an exemplary embodiment, the tubular portion TP2 abuts onto a region of the outer peripheral surface of the tubular portion TP 1 from the lower end to an intermediate position in the axis Z direction. Further, the tubular portion TP2 also abuts onto the outer peripheral surface of the lower portion of the support member SP1. The tubular portion TP2 is made of a conductive material such as, for example, aluminum. In an exemplary embodiment, a film made of yttrium oxide ($Y_2O_3$) may be foil led on the surface of the tubular portion TP2. Alternatively, the surface of the tubular portion TP2 may be subjected to an oxidation treatment.

An exhaust path VL is formed between the outer peripheral surface of the tubular portion TP2 and the outer peripheral surface of the annular portion AP, and the sidewall 12a. The exhaust path VL extends to the bottom 12b, and is connected to an exhaust pipe 28 attached to the bottom 12b. The exhaust pipe 28 is connected with an exhaust device 30. The exhaust device 30 includes a vacuum pump such as, for example, a pressure adjustor and a turbo molecular pump. The exhaust device 30 may be operated to exhaust a gas from the outer periphery of the placing table 20 via the exhaust path VL, and to decompress the processing space S in the processing chamber 12 to a desired degree of vacuum.

A baffle plate BP is provided in the middle of the exhaust path VL in the axis Z direction. The baffle plate BP is a plate-like member that extends annularly around the axis Z. The baffle plate BP is connected to the tubular portion TP2 by a screw member SR. The baffle plate BP includes a plurality of through-holes formed therein. The through-holes penetrate the baffle plate BP in the axis Z direction.

In the plasma processing apparatus 10, microwaves are propagated to the support member SP1 via the focus ring FR, the annular portion AP, and the tubular portion TP1. The microwaves propagated to the support member SP1 are transmitted through the support member SP1, and reach the interface between the support member SP1 and the cap 73. As described above, the dielectric constant of the cap 73 and the dielectric constant of the support member SP1 are substantially the same. Thus, even when the microwaves transmitted through the support member SP1 reach the interface between the support member SP1 and the cap 73, the microwaves are suppressed from being reflected on the interface between the support member SP1 and the cap 73. This suppresses an occurrence of standing waves in the vicinity of the placing table 20 due to the reflection of the microwaves. As a result, the uniformity of the electric field intensity in the vicinity of the placing table 20 may be maintained.

Further, in the plasma processing apparatus 10, the microwaves are propagated to the second electrode member 22b via the focus ring FR. The microwaves propagated to the second electrode member 22b are reflected by the second electrode member 22b. As described above, the cap 83 is fitted to each of the plurality of insertion portions 81 of the second electrode member 22b. Therefore, the microwaves directed to the screw member 82 are blocked by the cap 83. Thus, it is possible to avoid a situation where the microwaves are reflected by the screw member 82 in an unintended direction. This suppresses an occurrence of standing waves in the vicinity of the placing table 20 due to the reflection of the microwaves. As a result, the uniformity of the electric field intensity in the vicinity of the placing table 20 may be more securely maintained.

As described above, according to an exemplary embodiment, the dielectric cap 73 having a dielectric constant substantially equal to the dielectric constant of the support member SP1 is fitted to each of the plurality of insertion portions 71 of the support member SP1. Thus, even when the microwaves transmitted through the support member SP1 reach the interface between the support member SP1 and the cap 73, the microwaves are suppressed from being reflected on the interface between the support member SP1 and the cap 73. This suppresses an occurrence of standing waves in the vicinity of the placing table 20 due to the reflection of the microwaves. As a result, the uniformity of the electric field intensity in the vicinity of the placing table 20 may be maintained.

Further, according to an exemplary embodiment, the conductor cap 83 is fitted to each of the plurality of insertion portions 81 of the second electrode member 22b. Therefore, the microwaves directed to the screw member 82 are blocked by the cap 83. Thus, it is possible to avoid a situation where the microwaves are reflected by the screw member 82 in an unintended direction. This suppresses an occurrence of standing waves in the vicinity of the placing table 20 due to the reflection of the microwaves. As a result, the uniformity of the electric field intensity in the vicinity of the placing table 20 may be more securely maintained.

Figure 5:
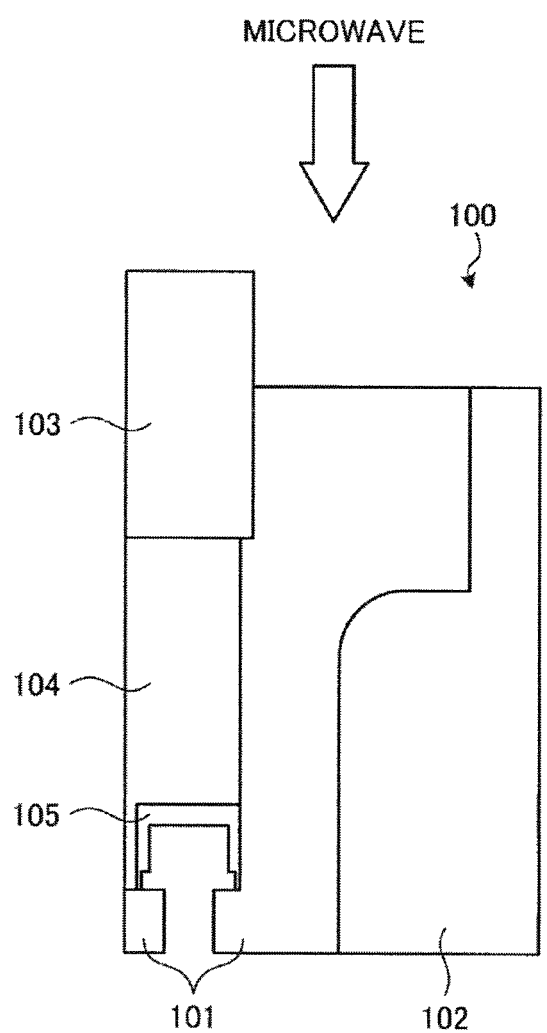
FIG. 5 is a view for explaining a simulation model in an exemplary embodiment.

Next, descriptions will be made on an effect (simulation result) by the plasma processing apparatus 10 according to an exemplary embodiment with reference to FIGS. 5 to 8. Here, prior to explaining the effect (simulation result) by the plasma processing apparatus 10 according to an exemplary embodiment, the simulation model in the exemplary embodiment will be described. FIG. 5 is a view for explaining a simulation model in an exemplary embodiment.

The simulation model 100 illustrated in FIG. 5 includes blocks 101 to 105. The block 101 corresponds to the support member SP1. The block 102 corresponds to the space surrounded by the support member SP1. The block 103 corresponds to the tubular portion TP1. The block 104 corresponds to the cap 73. The block 105 corresponds to the space between the cap 73 and the screw member 72. Further, in the simulation using the simulation model 100, it is assumed that microwaves having a frequency of 2.45 GHz and electric power of 1 kW are input from the top of the simulation model 100.

Figure 6:
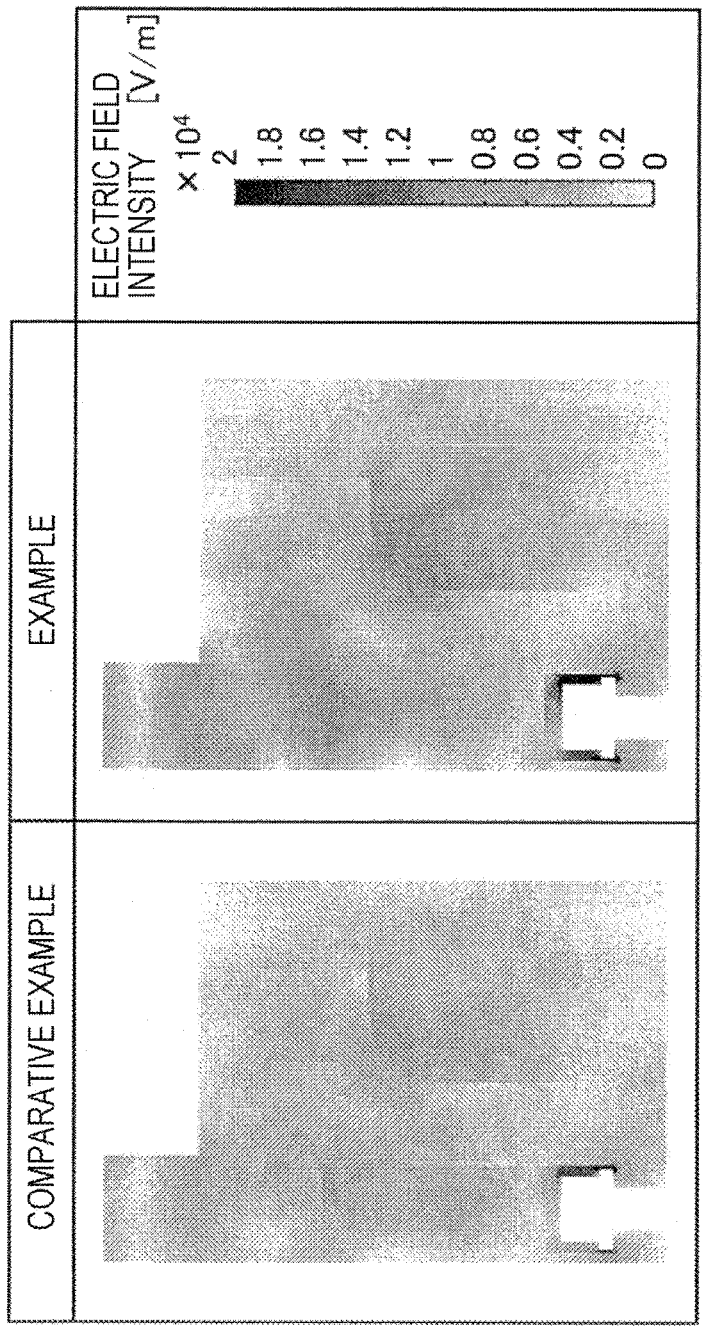
FIG. 6 is a view illustrating an effect (simulation result of an electric field intensity depending on a difference in dielectric constant of a cap) by the plasma processing apparatus according to an exemplary embodiment.
Figure 7:
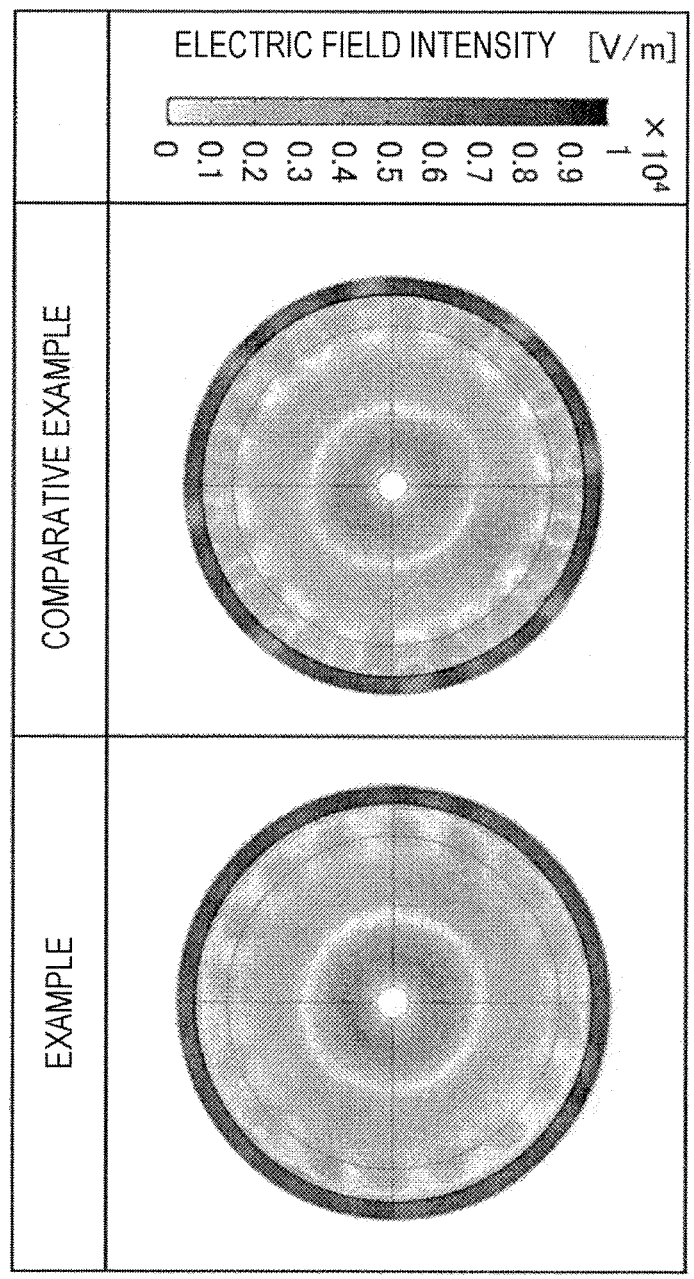
FIG. 7 is a view illustrating an effect (simulation result of an electric field intensity depending on a difference in dielectric constant of a cap) by the plasma processing apparatus according to an exemplary embodiment.

FIGS. 6 and 7 are views illustrating an effect (simulation result of the electric field intensity depending on a difference in dielectric constant of the cap) by the plasma processing apparatus according to an exemplary embodiment. FIG. 6 is a simulation result of the electric field intensity when the simulation model 100 illustrated in FIG. 5 is viewed from a direction perpendicular to the paper surface. FIG. 7 is a simulation result of the electric field intensity when the simulation model 100 illustrated in FIG. 5 is viewed from the upper side of the paper surface.

Further, in FIGS. 6 and 7, "Example" shows a simulation result of the electric field intensity in a case where the plasma processing apparatus 10 according to an exemplary embodiment is used, that is, a case where the cap 73 has a dielectric constant equal to that of the support member SP1. That is, in "Example," the dielectric constant of quartz was used as the dielectric constant of the cap 73 and the dielectric constant of the support member SP1. On the other hand, "Comparative Example" shows a simulation result of the electric field intensity in a case where the cap 73 has a dielectric constant different from the dielectric constant of the support member SP1. That is, in "Comparative Example," the dielectric constant of quartz was used as the dielectric constant of the support member SP1, and the dielectric constant of polytetrafluoroethylene (PTFE), which is a heat-resistant resin, was used as the dielectric constant of the cap 73.

As is apparent from the simulation results of FIGS. 6 and 7, in Example, the maximum value of the electric field intensity in the vicinity of the interface between the support member SP1 and the cap 73 was reduced as compared with that of Comparative Example. That is, it has been found that, when the dielectric constant of the cap 73 and the dielectric constant of the support member SP1 are the same, the reflection of the microwaves in the vicinity of the interface between the support member SP1 and the cap 73 is suppressed.

Figure 8:
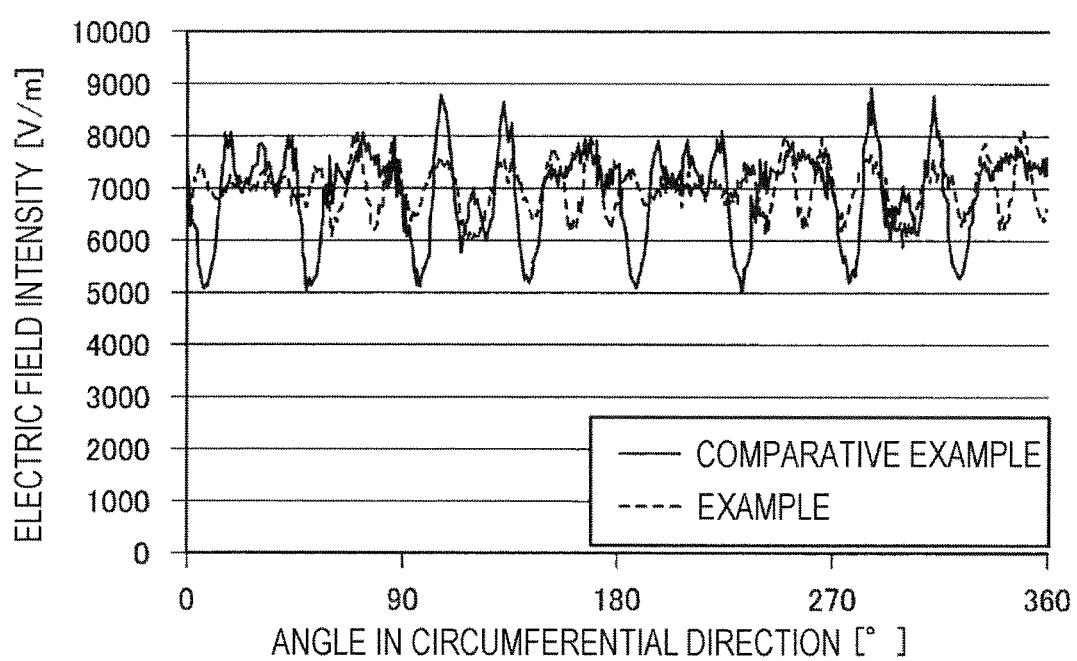
FIG. 8 is a view illustrating an effect (distribution of an electric field intensity of the support member in the circumferential direction) by the plasma processing apparatus according to an exemplary embodiment.

FIG. 8 is a view illustrating an effect (distribution of the support member in the circumferential direction) by the plasma processing apparatus according to an exemplary embodiment. The electric field intensity distribution in FIG. 8 is obtained by plotting the electric field intensity of the tubular portion TP1 in the simulation result of FIG. 7 at each of a plurality of angular positions along the circumferential direction of the support member SP1. In FIG. 8, the horizontal axis represents an angle along the circumferential direction of the support member SP1, and the vertical axis represents an electric field intensity of the tubular portion TP1.

As is apparent from FIG. 8, in Example, the deviation in electric field intensity of the tubular portion TP 1 along the circumferential direction of the support member SP1 was reduced as compared with that of Comparative Example. That is, even in the case where the plurality of insertion portions 71 are disposed so as not to be rotationally symmetrical when viewed from the direction along the center axis of the support member SP1, it has been found that when the dielectric constant of the cap 73 and the dielectric constant of the support member SP1 are the same, the uniformity of the electric field intensity of the tubular portion TP1, which is a member in the vicinity of the placing table 20, may be maintained.

In the exemplary embodiment, microwaves are used as the electromagnetic waves for plasma excitation, but the present disclosure is not limited thereto. For example, the electromagnetic waves for plasma excitation may be electromagnetic waves having a longer wavelength than that of microwaves or electromagnetic waves or electromagnetic waves having a shorter wavelength than that of microwaves.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
 a processing container into which an electromagnetic wave for plasma excitation is supplied;
 a placing table provided inside the processing container and configured to place a workpiece thereon;
 a first screw inserted into each of a plurality of insertion portions formed in a part of a dielectric body that transmits the electromagnetic wave, and configured to couple the dielectric body and a bottom portion of the processing container;
 a dielectric cap fitted to each of the plurality of insertion portions so as to cover the first screw and having a dielectric constant substantially equal to the dielectric constant of the dielectric body; and
 a tubular portion made of a dielectric material,
 wherein the placing table includes a first electrode, and the dielectric body is provided on the bottom portion of the processing container and supports the first electrode, and
 the tubular portion extends along an outer circumference of a top portion of the dielectric body, and is in contact with an outer periphery of the first electrode.

2. The plasma processing apparatus of claim 1, further comprising:
 a second screw inserted into each of a plurality of insertion portions formed in a part of a second electrode that reflects the electromagnetic wave, and configured to couple the second electrode and the first electrode; and
 a conductor cap fitted to each of the plurality of insertion portions formed in the second electrode so as to cover the second screw.

3. The plasma processing apparatus of claim 2, wherein the second electrode is provided on the first electrode.

4. A plasma processing apparatus comprising:
 a processing container into which an electromagnetic wave for plasma excitation is supplied;
 a placing table provided inside the processing container and configured to place a workpiece thereon;
 a screw inserted into each of a plurality of insertion portions formed in a part of a second electrode that reflects the electromagnetic wave, and configured to couple the second electrode and a first electrode;
 a conductor cap fitted to each of the plurality of insertion portions so as to cover the screw;
 a tubular portion made of a dielectric material; and
 a tube shaped dielectric body that supports the first electrode,
 wherein the placing table includes the first electrode, and the second electrode is provided on the first electrode, and the tubular portion extends along an outer circumference of a top portion of the tube shaped dielectric body, and is in contact with an outer periphery of the first electrode.

5. The plasma processing apparatus of claim 4, further comprising:
a focus ring provided on a top surface of the second electrode.

* * * * *